(12) United States Patent
Hong et al.

(10) Patent No.: US 10,466,408 B2
(45) Date of Patent: Nov. 5, 2019

(54) POLARIZER AND LIQUID CRYSTAL DISPLAY DEVICE INCLUDING THE SAME

(71) Applicant: LG Display Co., Ltd., Seoul (KR)

(72) Inventors: Ga-Ram Hong, Seoul (KR); Jin-Ho Kim, Gyeonggi-do (KR); Sang-Min Lee, Gyeonggi-do (KR); Ki-Duck Park, Gyeonggi-do (KR); Joo-Bin Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 302 days.

(21) Appl. No.: 15/249,693

(22) Filed: Aug. 29, 2016

(65) Prior Publication Data
US 2017/0059932 A1 Mar. 2, 2017

(30) Foreign Application Priority Data

Aug. 31, 2015 (KR) .................. 10-2015-0122625
Dec. 31, 2015 (KR) .................. 10-2015-0191651

(51) Int. Cl.
*G02F 1/1335* (2006.01)
*F21V 8/00* (2006.01)
(Continued)

(52) U.S. Cl.
CPC .......... *G02B 6/0073* (2013.01); *G02B 6/0068* (2013.01); *G02F 1/133533* (2013.01);
(Continued)

(58) Field of Classification Search
CPC .... G02B 6/0073; G02B 6/005; G02B 6/0055; G02B 6/009; G02B 6/00; G02B 5/3033;
(Continued)

(56) References Cited

U.S. PATENT DOCUMENTS 7,811,679 B2 * 10/2010 Aziz .................. H01L 51/5284
257/102
2013/0107170 A1 * 5/2013 Gee ..................... G02F 1/13362
349/65
(Continued)

FOREIGN PATENT DOCUMENTS

CN 104076548 A 10/2014
JP 2002-040233 A 2/2002
(Continued)

OTHER PUBLICATIONS

Office Action issued in corresponding Korean Patent Application No. 10-2015-0191651.
(Continued)

*Primary Examiner* — Eli D. Strah
(74) *Attorney, Agent, or Firm* — Morgan, Lewis & Bockius LLP

(57) ABSTRACT

A liquid crystal display device containing a liquid crystal panel that includes a first substrate, a second substrate, and first and second polarizers at respective outer surfaces of the first and second substrates; and a backlight unit under the liquid crystal panel that includes a light source, wherein the light source includes a first luminous body having a first peak wavelength, a second luminous body having a second peak wavelength greater than the first peak wavelength, and a third luminous body having a third peak wavelength greater than the second peak wavelength, and wherein the first polarizer contains a light absorption layer having an absorption peak between the second peak wavelength and the third peak wavelength.

19 Claims, 9 Drawing Sheets

(51) Int. Cl.
  *H01L 25/075* (2006.01)
  *H01L 33/50* (2010.01)
  *H01L 31/0352* (2006.01)
  *H01L 51/50* (2006.01)
  *G02B 5/30* (2006.01)
  *G02B 5/22* (2006.01)

(52) U.S. Cl.
  CPC ..... *B32B 2457/20* (2013.01); *B32B 2457/202* (2013.01); *B32B 2457/206* (2013.01); *G02B 5/22* (2013.01); *G02B 5/223* (2013.01); *G02B 5/30* (2013.01); *G02B 5/305* (2013.01); *G02B 5/3025* (2013.01); *G02B 5/3033* (2013.01); *G02B 5/3041* (2013.01); *G02F 1/133615* (2013.01); *G02F 2001/133614* (2013.01); *G02F 2201/50* (2013.01); *G02F 2202/28* (2013.01); *H01L 25/0753* (2013.01); *H01L 31/035209* (2013.01); *H01L 31/035218* (2013.01); *H01L 31/035227* (2013.01); *H01L 33/504* (2013.01); *H01L 33/507* (2013.01); *H01L 51/50* (2013.01); *H01L 51/502* (2013.01); *H01L 51/5012* (2013.01); *H01L 2251/50* (2013.01); *Y10T 428/1036* (2015.01); *Y10T 428/1041* (2015.01)

(58) Field of Classification Search
  CPC ........ G02B 5/3041; G02B 5/223; G02B 5/22; G02B 5/3025; G02B 5/30; G02B 5/305; G02F 1/133533; G02F 1/133615; G02F 2202/28; G02F 2201/50; G02F 2001/133614; H01L 2251/50; H01L 51/50; H01L 51/502; H01L 51/5012; H01L 31/035218; H01L 31/035209; H01L 31/035227; H01L 25/0753; H01L 33/504; H01L 33/507; Y10T 428/1036; Y10T 428/1041; B32B 2457/20; B32B 2457/202; B32B 2457/206
  See application file for complete search history.

(56) References Cited

U.S. PATENT DOCUMENTS

| | | | |
|---|---|---|---|
| 2015/0014728 A1* | 1/2015 | Do | C09K 11/565 257/98 |
| 2016/0005933 A1* | 1/2016 | Chang | H01L 33/52 257/98 |
| 2018/0239079 A1* | 8/2018 | Park | G02B 6/0073 |

FOREIGN PATENT DOCUMENTS

| | | | | |
|---|---|---|---|---|
| JP | 2002040233 A | * | 2/2002 | |
| JP | 2012-084512 A | | 4/2012 | |
| JP | 2012084512 A | * | 4/2012 | |
| KR | 10-2013-0072048 A | | 7/2013 | |
| KR | 20130072048 A | * | 7/2013 | ......... G02B 5/3025 |
| KR | 10-2014-0082203 A | | 7/2014 | |
| KR | 20140082203 A | * | 7/2014 | ....... G02F 1/133514 |

OTHER PUBLICATIONS

First Office Action issued in corresponding Chinese Patent Application No. 201610770289.4, dated Feb. 3, 2019.

* cited by examiner

POLARIZER AND LIQUID CRYSTAL DISPLAY DEVICE INCLUDING THE SAME

CROSS-REFERENCE TO RELATED APPLICATION

The present application claims priority under U.S.C. § 119(a) to Korean Patent Application Nos. 10-2015-0122625 filed on Aug. 31, 2015 and 10-2015-0191651 filed on Dec. 31, 2015, each of which is hereby incorporated by reference in its entirety.

BACKGROUND

Field of the Disclosure

The present disclosure relates to a liquid crystal display device, and more particularly, to a polarizer and a display device including the same that have a light-absorption layer absorbing at a specific wavelength and a wide color gamut.

Discussion of the Related Art

A liquid crystal display (LCD) device includes two substrates and a liquid crystal layer between the two substrates and transmits light by controlling an arrangement of liquid crystal molecules of the liquid crystal layer, thereby displaying an image.

In general, the LCD device includes a plurality of pixels arranged in a matrix form, and each pixel includes a thin film transistor, a pixel electrode and a common electrode. Voltages are applied to the pixel electrode and the common electrode of each pixel, and an electric field is generated between the pixel electrode and the common electrode. The liquid crystal molecules of the liquid crystal layer are rearranged by the generated electric field, and the transmittance of the liquid crystal layer is changed. Therefore, by adjusting the voltages applied to the pixel electrode and the common electrode of the LCD device, the transmittance of the liquid crystal layer of each pixel can be controlled to produce a value corresponding to an image signal. As a result, the LCD device displays an image.

The LCD device is not self-luminous, and thus additional light should be provided to the LCD device. Accordingly, the LCD device includes a liquid crystal panel displaying the image and a backlight unit providing light to the liquid crystal panel.

The backlight unit includes a light source. A fluorescent lamp such as a cold cathode fluorescent lamp (CCFL) or an external electrode fluorescent lamp (EEFL) has been used for the light source.

The backlight unit is classified as a direct-type or an edge-type depending on the path of light emitted from the light source. In a direct-type backlight unit, a plurality of lamps is disposed under the liquid crystal panel, and light emitted from the lamp is directly provided to the liquid crystal panel. In an edge-type backlight unit, a light guide plate is disposed under the liquid crystal panel and a lamp is disposed at at least one side of the light guide plate. Then, light emitted from the lamp is refracted and reflected by the light guide plate and is indirectly provided to the liquid crystal panel.

Recently, the edge-type backlight unit has been widely used in accordance with the request for a thin and light weight LCD device, and a light emitting diode (LED) lamp has replaced the fluorescent lamp because of its advantages in power consumption, weight and brightness.

FIG. 1 is a schematic cross-sectional view of an LCD device including an edge-type backlight unit according to the related art.

In FIG. 1, the related art LCD device includes a liquid crystal panel 10, a backlight unit 20, a main frame 30, a top frame 40, and a bottom frame 50.

The liquid crystal panel 10 includes a lower substrate 12 and an upper substrate 14, and a liquid crystal layer (not shown) is disposed between the substrates 12 and 14. A lower polarizer 18 is disposed under the lower substrate 12, and an upper polarizer 19 is disposed over the upper substrate 14.

A driving unit (not shown) comprising driver integrated circuits (driver ICs) is connected to a side of the liquid crystal panel 10 and provides signals to a plurality of pixels (not shown) in the liquid crystal panel 10.

The backlight unit 20 is disposed under the liquid crystal panel 10 and includes a reflective sheet 22, a light guide plate 24, and an optical sheet 26 sequentially placed from the bottom. Meanwhile, a light emitting diode (LED) assembly 28 is disposed at a side of the light guide plate 24 as a light source. The LED assembly 28 includes an LED printed circuit board 28a and an LED package 28b.

The main frame 30 surrounds sides of the liquid crystal panel 10 and the backlight unit 20. The main frame 30 constitutes a module with the top frame 40 at a front side of the liquid crystal panel 10 and the bottom frame 50 at a rear side of the backlight unit 20.

Since the related art LCD device has a relatively low color gamut, the related art LCD device does not express relatively more colors, and it is difficult to display a high-quality image.

FIG. 2 is a view illustrating the color gamut of a related art LCD device in CIE (International Commission on Illumination) 1976 chromaticity diagram. FIG. 2 also shows the DCI (digital cinema initiative) color standard.

Generally, to attain a wide color gamut, an overlap ratio of the color gamut of a display device to the DCI color standard should be more than 95%. However, as shown in FIG. 2, the color gamut NCG of the related art LCD device has a smaller area than the DCI color standard, and the overlap ratio is about 81.0%. Therefore, it is difficult that the related art LCD device has a relatively wide color gamut.

SUMMARY

Accordingly, the present invention is directed to a polarizer and an LCD device comprising the same that substantially obviate one or more of the problems due to limitations and disadvantages of the related art.

An object of the present disclosure is to provide an LCD device that has a wide color gamut.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a liquid crystal display device that comprises a liquid crystal panel that comprises a first substrate, a second substrate, and first and second polarizers at respective outer surfaces of the first and secondsubstrates, and a backlight unit under the liquid crystal panel and comprising a light source, wherein the light source includes a first luminous body having a first peak wavelength, a second luminous body having a second peak wavelength larger than the first peak wavelength, and a third luminous body having a third peak wavelength larger than the second peak wavelength, and wherein the first polarizer includes a light absorption layer having an absorption peak between the second peak wavelength and the third peak wavelength.

In another aspect, a polarizer includes a polarizing film and a light absorption layer at a surface of the polarizing film and comprising a metal-coordination tetra-azaporphyrin compound of the following chemical formula:

Chemical formula

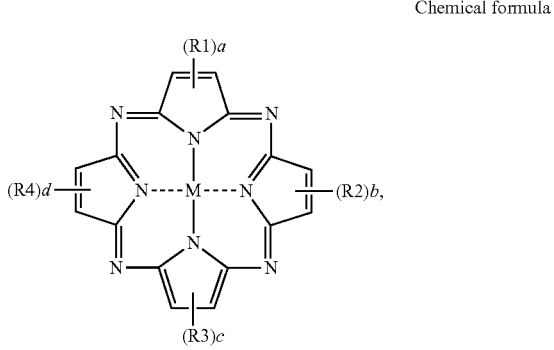

wherein M is selected from the group consisting of Ni, Mg, Mn, Co, Cu, Ru and V, or M is selected from the group consisting of Mn and Ru to which at least one ligand selected from the group consisting of $NH_3$, $H_2O$ and a halogen atom is coordinated, wherein each of R1, R2, R3, and R4 is independently selected from the group consisting of a C10 to C10 alkyl group and a C6 to C30 aromatic group, wherein each of a, b, c and d is independently 1 or 2, and wherein the light absorption layer further includes a binder, and the metal-coordination tetra-azaporphyrin compound is present in an amount of 0.6 wt % to 1.2 wt % based on the binder.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and which are incorporated in and constitute a part of this specification, illustrate embodiments of the invention and together with the description serve to explain the principles of the invention. In the drawings.

DETAILED DESCRIPTION

Reference will now be made in detail to embodiments of the disclosure, examples of which are illustrated in the accompanying drawings.

Figure 1:
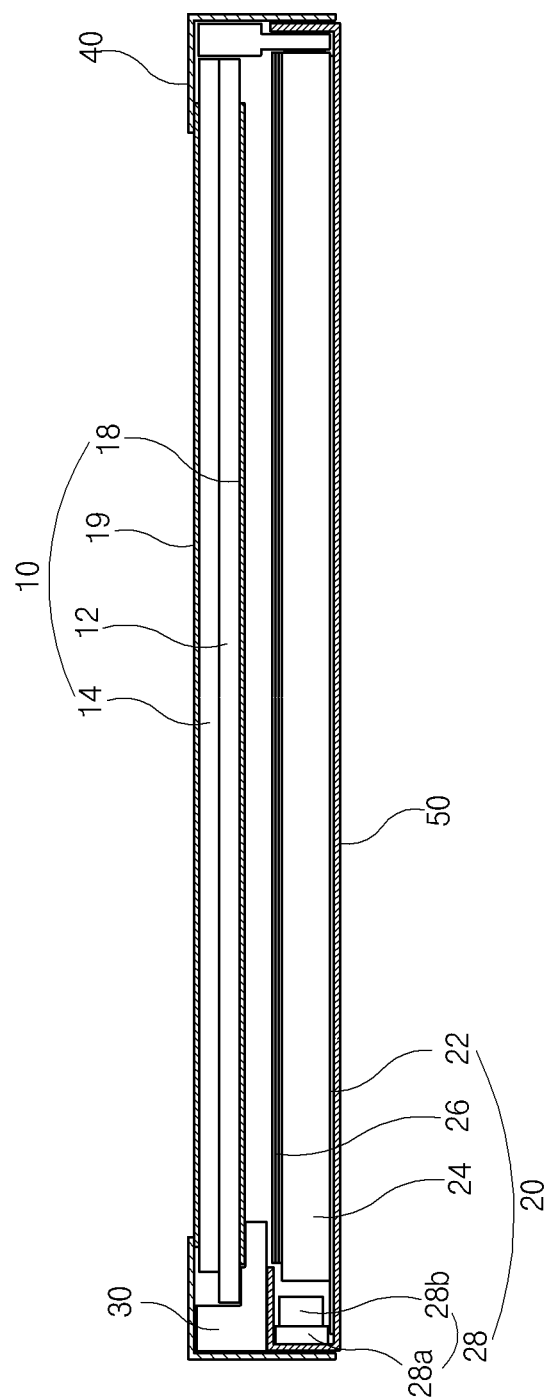
FIG. 1 is a schematic cross-sectional view of an LCD device including an edge-type backlight unit according to the related art.
Figure 2:
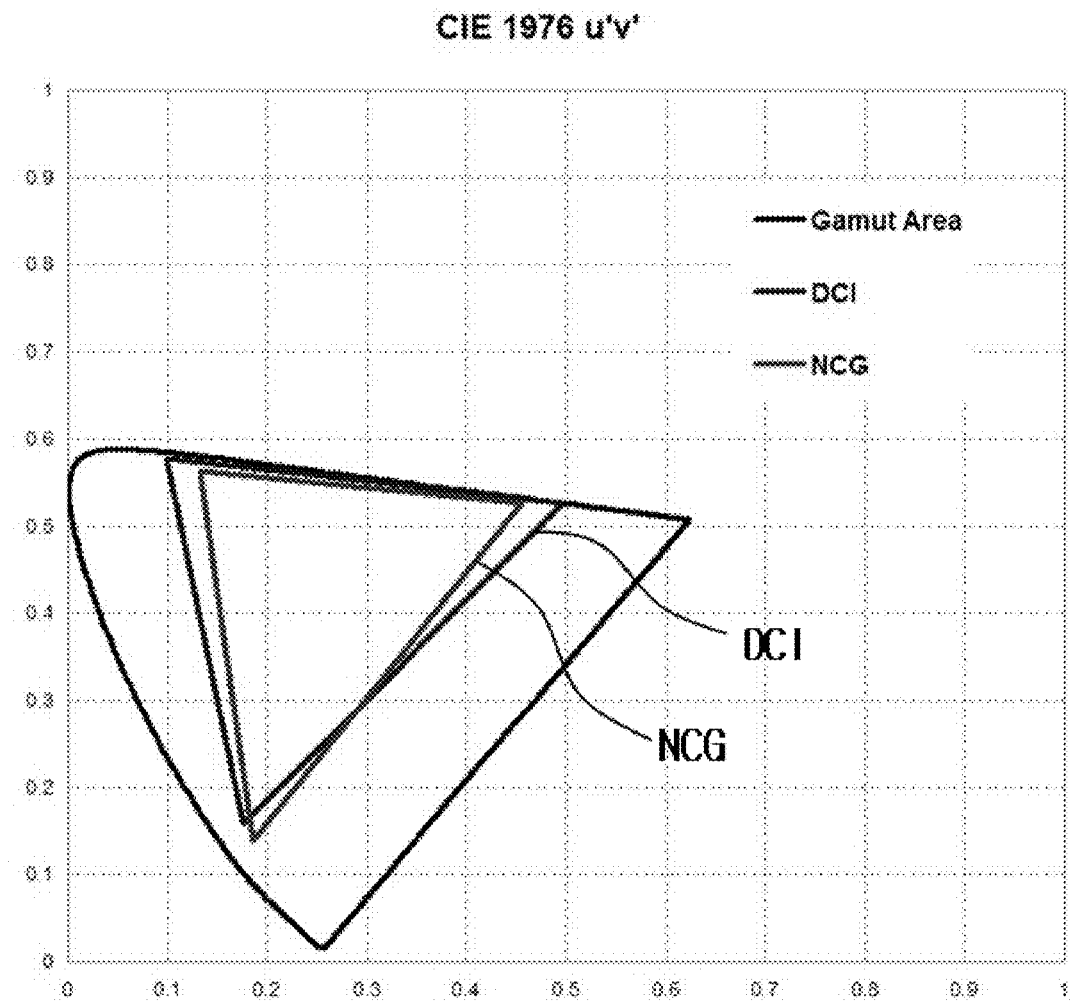
FIG. 2 is a view illustrating a color gamut of a related art LCD device in a CIE 1976 chromaticity diagram.
Figure 3:
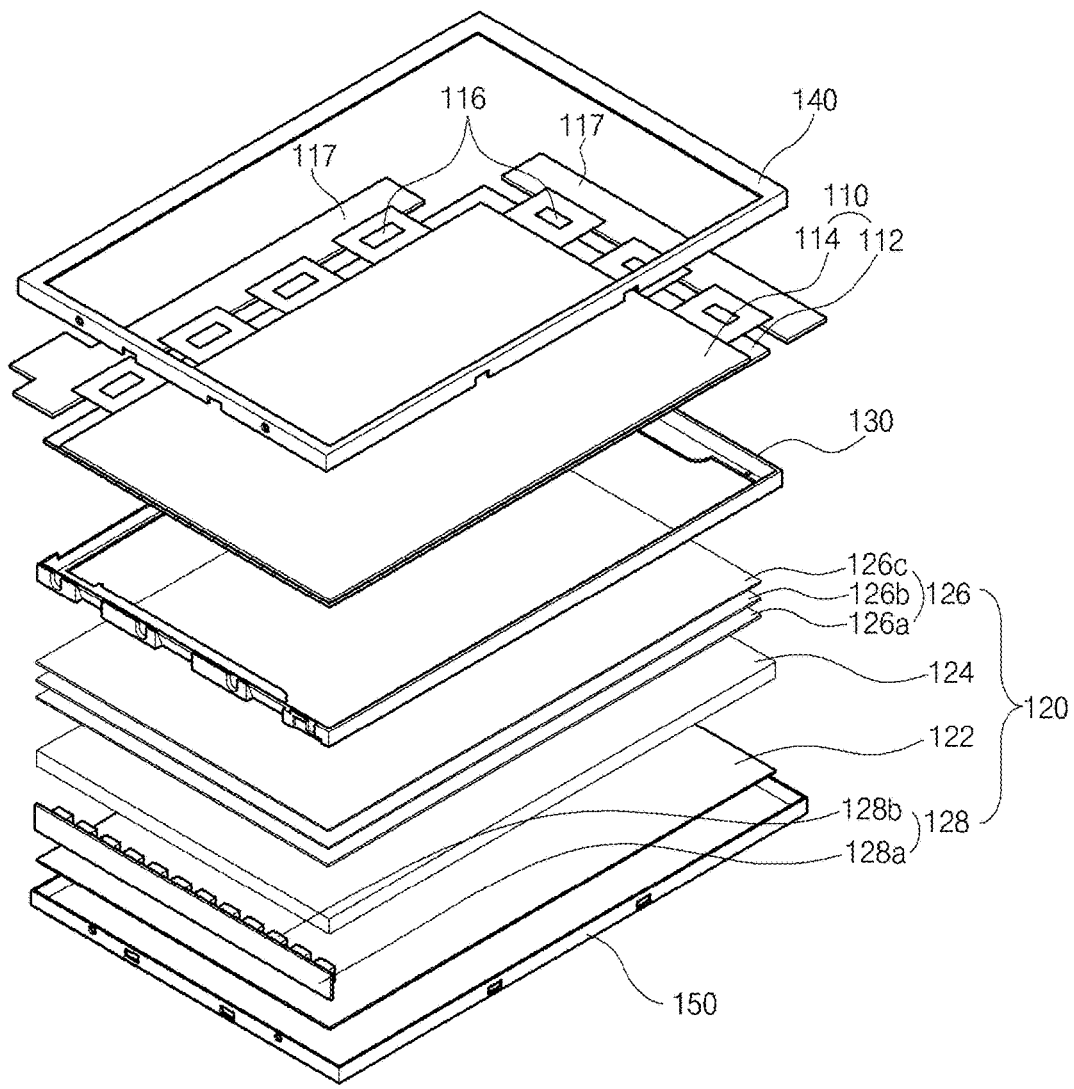
FIG. 3 is a schematic perspective view of an LCD device according to an embodiment of the present invention.
Figure 4:
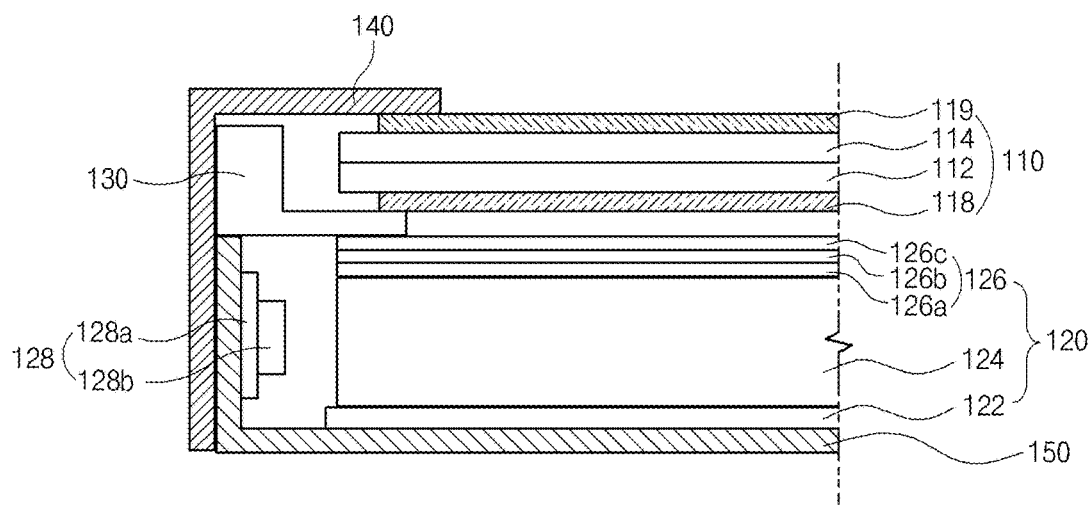
FIG. 4 is a schematic cross-sectional view of an LCD device according to an embodiment of the present invention.

FIG. 3 is a schematic perspective view of an LCD device according to an embodiment of the present invention, and FIG. 4 is a schematic cross-sectional view of an LCD device according to an embodiment of the present invention.

In FIG. 3 and FIG. 4, the LCD device according to an embodiment of the present invention includes a liquid crystal panel 110, a backlight unit 120, a main frame 130, a top frame 140, and a bottom frame 150.

The liquid crystal panel 110 displays an image and includes a first substrate 112, a second substrate 114, a liquid crystal layer (not shown), a first polarizer 118, and a second polarizer 119. The second substrate 114 is disposed over the first substrate 112, and the liquid crystal layer is interposed between the first and second substrates 112 and 114. The first and second polarizers 118 and 119 are disposed at outer surfaces of the first and second substrates 112 and 114, respectively.

Although not shown in the figures, the first substrate 112 includes a plurality of gate lines and a plurality of data lines on its inner surface. The gate lines and the data lines cross each other to define pixel regions. A thin film transistor and a pixel electrode are disposed at each pixel region. The thin film transistor is connected to each of the gate lines and the data lines, and the pixel electrode is connected to the thin film transistor. The first substrate 112 may be referred to as a lower substrate or an array substrate.

In addition, although not shown in the figures, the second substrate 114 includes a black matrix and a color filter layer on its inner surface. The black matrix has openings corresponding to the pixel regions, and the color filter layer includes red, green and blue color filter patterns respectively corresponding to the openings and sequentially arranged. The second substrate 114 may be referred to as an upper substrate and a color filter substrate.

A common electrode is formed on the first substrate 112 or the second substrate 114. The common electrode and the pixel electrode constitute a liquid crystal capacitor with the liquid crystal layer interposed therebetween. For example, the common electrode may be formed in the pixel region of the first substrate 112. The common electrode and the pixel electrode may be patterned to have a rod shape and may be alternately arranged.

The first and second polarizers 118 and 119 are attached to the outer surfaces of the first and second substrates 112 and 114, respectively and selectively transmit specific light. The first and second polarizers 118 and 119 transmit linearly-polarized light parallel to their light-transmission axes, respectively. The light-transmission axis of the first polarizer 118 is perpendicular to the light-transmission axis of the second polarizer 119.

The first polarizer 118 or the second polarizer according to an embodiment of the present invention includes a light-absorption layer absorbing light within a wavelength range between red and green, and will be explained in detail later.

Driver integrated circuits (driver ICs) 116 are attached to at least one side of the liquid crystal panel 110 through connecting means such as tape carrier packages (TCPs), and the driver ICs 116 are connected to a printed circuit board (PCB) 117. The PCB 117 is bent during a modularization process and is disposed at a side surface of the main frame 130 or at a rear surface of the bottom frame 150.

The backlight unit 120 is disposed under the liquid crystal panel 110, and the backlight unit 120 provides light to the liquid crystal panel 110. The backlight unit 120 includes a reflection sheet 120, a light guide plate 124, an optical sheet 126, and a light-emitting diode (LED) assembly 128.

The LED assembly 128, as a light source of the backlight unit 120, includes an LED printed circuit board 128a and a plurality of LED packages 128b. The LED packages 128b are mounted on a surface of the LED printed circuit board 128a and are disposed with a predetermined distance therebetween along a length of the LED printed circuit board 128a. As shown, the LED packages 128b are arranged in a line. Alternatively, the LED packages 128b may be arranged in two or more lines.

Each of the LED packages 128b according to this embodiment of the present invention includes a blue (B) LED chip, a yellow (Y) phosphor, and a red (R) phosphor and emits white light as further described in detail herein.

The LED assembly 128 is disposed at a side of the light guide plate 124. The LED assembly 128 may be disposed at a short side of the light guide plate 124. The light guide plate 124 reflects and refracts light, which is incident on its inside from the LED packages 128a through its side surface, and moves the light toward its front surface, thereby implementing a surface light source. The side surface of the light guide plate 124, through which the light is incident on the inside, may be referred to as a light-incident surface.

To provide a uniform surface light source, the light guide plate 124 may include predetermined patterns at its rear surface. For example, to guide the light incident on the inside of the light guide plate 124, the patterns may be elliptical patterns, polygonal patterns or hologram patterns. The patterns may be formed by a printing method or an injecting method.

The reflection sheet 122 is disposed under the rear surface of the light guide plate 124. The reflection sheet 122 reflects light passing through the rear surface of the light guide plate 124 toward the liquid crystal panel 110 to increase the brightness.

The optical sheet 126 is disposed over the light guide plate 124. The optical sheet 126 includes a diffusion sheet and at least a light-concentrating sheet. The optical sheet 126 diffuses or concentrates light passing through the light guide plate 124 such that more uniform surface light source is provided to the liquid crystal panel 110. The optical sheet 126 may include first, second and third optical sheets 126a, 126b, 126c sequentially disposed over the light guide plate 124.

For instance, each of the first and second optical sheets 126a and 126b may be a light-concentrating sheet, and the third optical sheet 126c may be a diffusion sheet. The light-concentrating sheet may include prism patterns or lenticular patterns. The first optical sheet 126a may include lenticular patterns, and the second optical sheet 126b may include prism patterns.

The third optical sheet 126c may be a brightness enhancement film. The brightness enhancement film may include layers having different refractive indexes, which are alternately layered.

The liquid crystal panel 110 and the backlight unit 120 are modularized with the main frame 130, the top frame 140, and the bottom frame 150.

The main frame 130 has a rectangular frame shape and includes a vertical portion and a horizontal portion. The liquid crystal panel 110 is disposed over the horizontal portion, and the backlight unit 120 is disposed under the horizontal portion. The vertical portion of the main frame 130 surrounds side surfaces of the liquid crystal panel 110.

The bottom frame 150 includes a horizontal surface on which the backlight unit 120 is disposed and side surfaces perpendicular to the horizontal surface. The LED assembly 128 is disposed on one of the side surfaces of the bottom frame 150.

The top frame 140 has a rectangular frame shape, and the top frame 140 has a cross-sectional surface of a reverse L-like shape to cover edges of a front surface and side surfaces of the liquid crystal panel 110. The top frame 140 includes an opening at the center of its front surface, and images produced by the liquid crystal panel 110 are displayed to the outside through the opening.

The top frame 140, the main frame 130 and the bottom frame 150 are assembled and combined with each other, and the LCD device of the present invention is modularized. The top frame 140 may be omitted.

The top frame 140 may be referred to as a case top, top case or a top cover. The main frame 130 may be referred to as a guide panel or a main support. The bottom frame 150 may be referred to as a cover bottom or a bottom cover.

As stated above, the LCD device according to an embodiment of the present invention includes the LED package 128b with the blue (B) LED chip, the yellow (Y) phosphor, and the red (R) phosphor. Hereinafter, the LED package 128b will be described in more detail with reference to accompanying drawings.

Figure 5A:
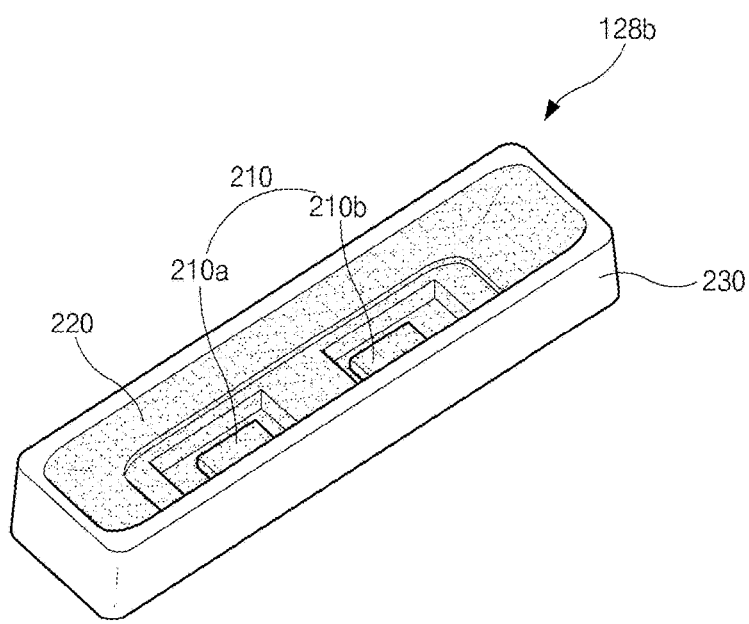
FIG. 5A is a perspective view schematically illustrating an LED package according to an embodiment of the present invention.
Figure 5B:
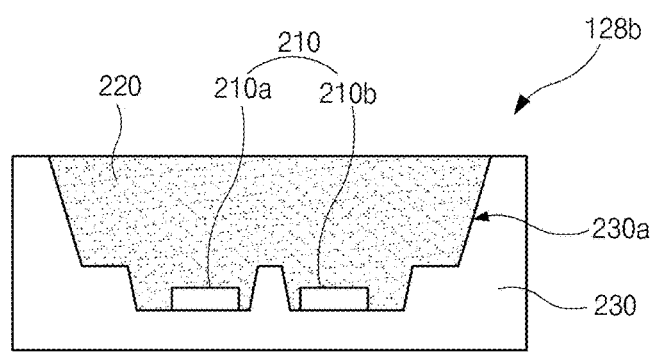
FIG. 5B is a cross-sectional view schematically illustrating the LED package according to an embodiment of the present invention.

FIG. 5A is a perspective view of schematically illustrating an LED package according to an embodiment of the present invention, and FIG. 5B is a cross-sectional view of schematically illustrating the LED package according to this embodiment of the present invention.

In FIG. 5A and FIG. 5B, the LED package 128b according to this embodiment of the present invention includes an LED chip 210, a resin layer 220 containing phosphors, and a mold frame 230.

The LED chip 210 may include a first chip 210a and a second chip 210b. Each of the first and second chips 210a and 210b emits blue light and is electrically connected to the LED printed circuit board 128a of FIG. 3 through a wire bonding. The two chips 210a and 210b are used, and the number of chips is not limited to this.

The mold frame 230 has a cavity inside. The first and second chips 210a and 210b are disposed in the cavity. More particularly, the first and second chips 210a and 210b are disposed on a bottom surface of the mold frame 230 corresponding to the cavity and are spaced apart from each other. A side surface of the mold frame 230 corresponding to the cavity has an inclined reflective surface 230a to send light from the first and second chips 210a and 210b upwards. The cavity may further include a dented portion corresponding to each of the first and second chips 210a and 210b.

Although not shown in the figures, the mold frame 230 may include a lower frame and an upper frame which are separable, and a lead frame may be disposed between the lower frame and the upper frame. The lead frame may be connected to the first and second chips 210a and 210b and provide voltages such that recombination of an electron and a hole is generated in each of the first and second chips 210a and 210b.

The resin layer 220 containing phosphors is formed in the cavity and covers the first and second chips 210a and 210b. For instance, the phosphors may be dispersed in silicone resin. In addition, the phosphors may include a yellow (Y) phosphor and a red phosphor (R).

Each of the first and second chips 210a and 210b has a peak wavelength region of about 444 nm, the yellow (Y) phosphor has a peak wavelength region of about 540 nm, and the red (R) phosphor has a peak wavelength region of about 650 nm.

The LED package 128b according to an embodiment of the present invention relatively decreases a blue intensity and relatively increases yellow and red intensities as compared with a conventional LED package. To accomplish this, the total content of the yellow (Y) phosphor and the red (R) phosphor, beneficially, is about 2.0 wt % to about 20 wt % of a content of the resin layer 220, and more beneficially, about 5.8 wt % of a content of the resin layer 220. At this time, it is desirable that the content of the yellow (Y) phosphor is larger than the content of the red (R) phosphor. It is beneficial that the mixing ratio by weight of the yellow (Y) phosphor to the red (R) phosphor is 55:45.

The LED package 128b has an overlap region between red light and green light, and thus the color gamut of an LCD device including the LED package 128b is lowered. Accordingly, in the LCD device having the LED package 128b according to an embodiment of the present invention, the first polarizer 118 of FIG. 4 under the liquid crystal panel 110 of FIG. 4 or the second polarizer 119 of FIG. 4 over the liquid crystal panel 110 of FIG. 4 includes a light absorption layer absorbing light within a wavelength range between red and green, and the color gamut of the LCD device increases.

The light absorption layer may include a light absorption material having an absorption peak in a wavelength region of 590 nm. For example, the light absorption material includes a metal-coordination tetra-azaporphyrin compound expressed by the following chemical formula 1.

Chemical formula 1

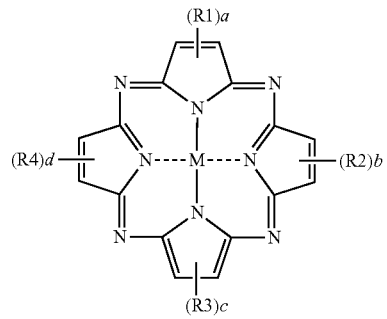

M is selected from Ni, Mg, Mn, Co, Cu, Ru and V. At least one ligand, which is selected from $NH_3$, $H_2O$ and a halogen atom, may be coordinated to any of Ni, Mg, Mn, Co, Cu, Ru and V, such as to, in a particular embodiment, Mn or Ru. In addition, each of R1, R2, R3, and R4 may be independently selected from a C1 to C10 alkyl group and a C6 to C30 aromatic group, and each of a, b, c and d may be 1 or 2. For example, a C1 to C10 alkyl group may include but is not limited to methyl, ethyl, propyl or butyl, and a C6 to C30 aromatic group may be, but is not limited to, phenyl.

Figure 6A:
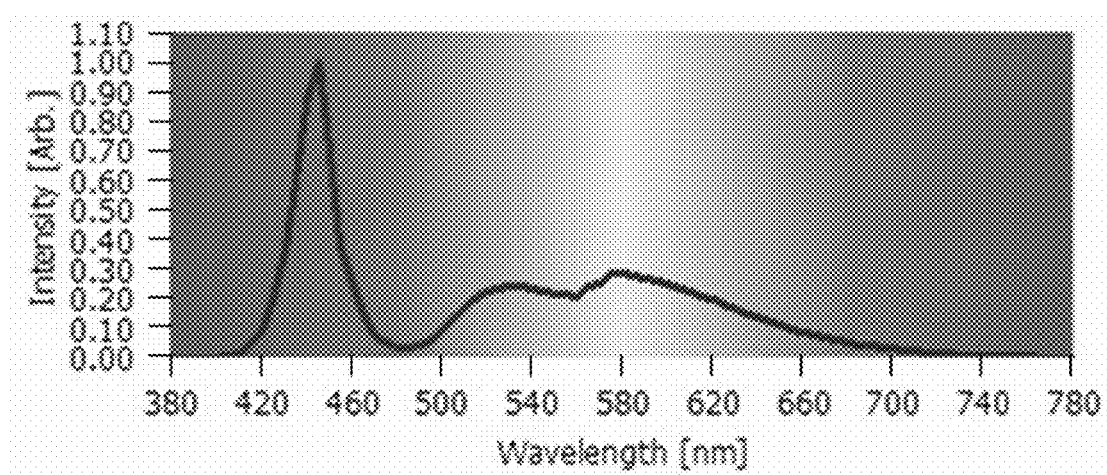
FIG. 6A is a view illustrating an emission spectrum of an LED package of the LCD device according to an embodiment of the present invention.
Figure 6B:
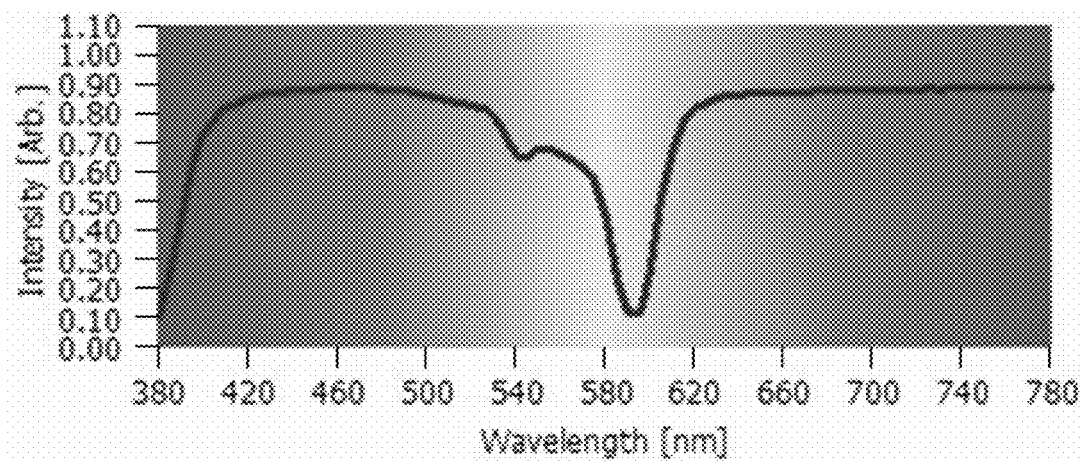
FIG. 6B is a view illustrating an absorption spectrum of a light absorption layer of the LCD device according to an embodiment of the present invention.
Figure 6C:
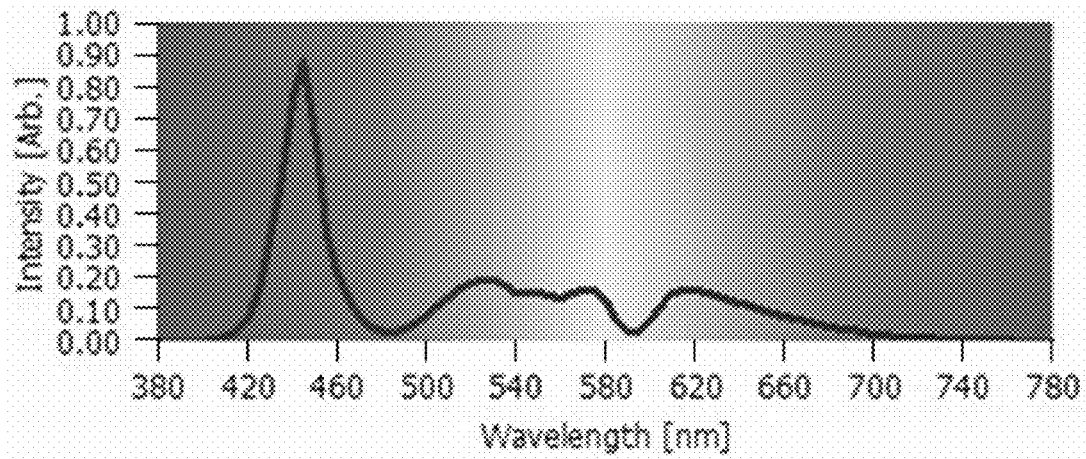
FIG. 6C is a view of illustrating a spectrum light passing through the LED package and the light absorption layer of the LCD device according to an embodiment of the present invention.

FIG. 6A illustrates an emission spectrum of an LED package of the LCD device according to an embodiment of the present invention, FIG. 6B illustrates an absorption spectrum of a light absorption layer of the LCD device according to an embodiment of the present invention, and FIG. 6C is illustrates a spectrum light passing through the LED package and the light absorption layer of the LCD device according to an embodiment of the present invention.

In FIG. 6A, light emitted from the LED package of the LCD device according to an embodiment of the present invention a blue peak wavelength, and there is an overlap region in a wavelength range between red and green.

On the other hand, in FIG. 6B, the light absorption layer of the LCD device according to an embodiment of the present invention has a strong absorption peak in a wavelength range between red and green.

Therefore, when the LCD device according to an embodiment of the present invention includes a light absorption layer and light emitted from the LED package passes through the light absorption layer, as shown in FIG. 6C, the overlap region in the wavelength range between red and green can be removed, and pure red and green can be produced.

Figure 7:
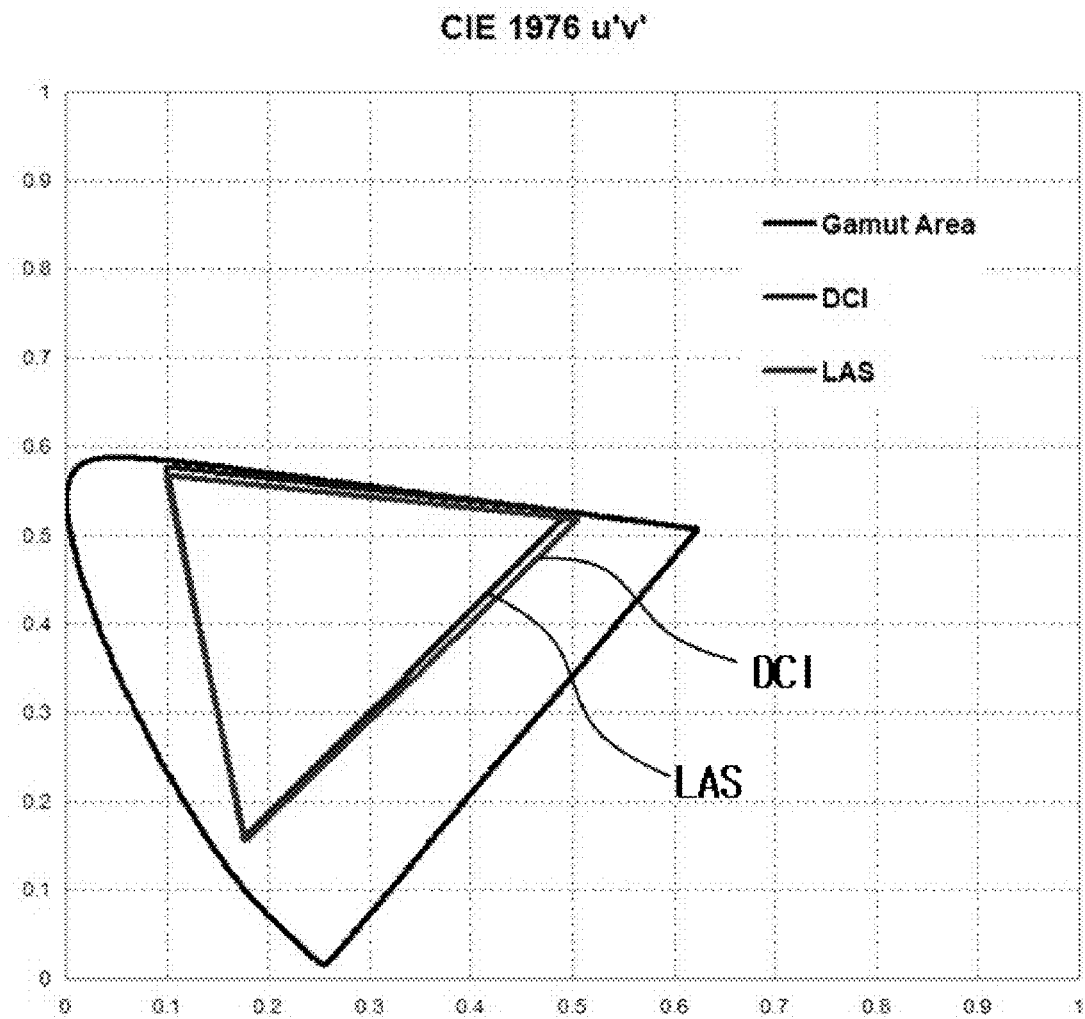
FIG. 7 is a view illustrating the color gamut of the LCD device according to an embodiment of the present invention in a CIE 1976 chromaticity diagram.

The color gamut of the LCD device including the LED package and the light absorption layer is shown in FIG. 7. FIG. 7 is a view illustrating the color gamut of the LCD device according to an embodiment of the present invention in a CIE (International Commission on Illumination) 1976 chromaticity diagram. FIG. 7 also shows the DCI (digital cinema initiative) color standard.

The CIE 1976 chromaticity diagram is chromaticity coordinates suggested to improve a uniform problem between a color matching interval on vision and a color matching interval on coordinates, which is a disadvantage of XYZ chromaticity coordinates, and shows human color perception with u' and v'. A similar distance on the CIE 1976 chromaticity diagram means a difference between colors similarly perceived.

In FIG. 7, an overlap ratio of the color gamut LAS of the LCD device according to an embodiment of the present invention, which includes the LED package and the light absorption layer, to the DCI color standard is 95%, and the LCD device according to this embodiment of the present invention has relatively wide color gamut.

The LCD device according to an embodiment of the present invention can have a relatively wide color gamut at relatively low costs by controlling the total content and the mixing ratio of the yellow (Y) and red (R) phosphors of the LED package containing the blue (B) LED chip and by using the light absorption layer absorbing light within a wavelength range between red and green.

Meanwhile, a condition for white of an LCD device used for televisions requires color coordinates of (Wx, Wy)= (0.278, 0.288) and a color temperature of 10,000K in the CIE 1931 chromaticity diagram. The condition for white according to the DCI color standard can be satisfied within an error range of ±0.015 by using the LED package and the light absorption layer of the present invention.

In addition, relative luminance efficiency of light passing through the light absorption layer to light emitted from the LED package is more than about 70%, and a decrease in brightness is relatively low. Thus, the power consumption is prevented from increasing. When an optical sheet comprising a brightness enhancement film is disposed under the first polarizer that comprises the light absorption layer, the relative luminance efficiency is more than about 80%, and higher luminance efficiency can be obtained.

Hereinafter, a polarizer comprising a light absorption layer according to various embodiments of the present invention will be described in detail with reference to the accompanying drawings.

First Embodiment

Figure 8:
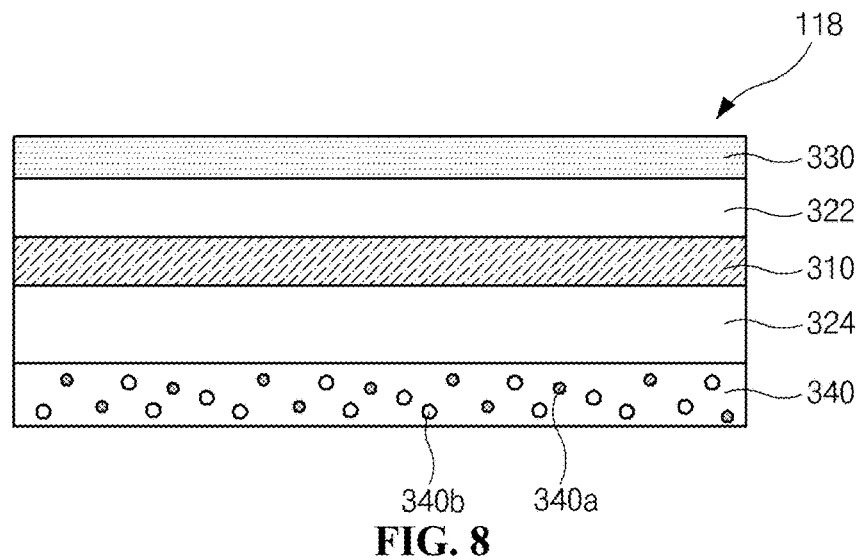
FIG. 8 is a cross-sectional view schematically illustrating a first polarizer including a light absorption layer according to a first embodiment of the present invention.

FIG. 8 is a cross-sectional view schematically illustrating a first polarizer including a light absorption layer according to a first embodiment of the present invention.

In FIG. 8, the first polarizer 118 according to the first embodiment of the present invention includes a polarizing film 310, first and second support films 322 and 324, an adhesive layer 330, and a light absorption layer 340.

The polarizing film 310 is disposed between the first and second support films 322 and 324. The adhesive layer 330 is disposed at an outer surface of the first support film 322, and the light absorption layer 340 is disposed at an outer surface of the second support film 324.

The polarizing film 310 may include polyvinyl alcohol (PVA). The polarizing film 310 may be formed by dyeing a PVA film with iodine ions or dichroic dyes and stretching the dyed PVA film. The polarizing film 310 has an absorption axis along a stretching direction, and the polarizing film 310 absorbs light vibrating in a direction parallel to the absorption axis and transmits light vibrating in a direction perpendicular to the absorption axis. The polarizing film 310 may have a thickness of about 25 micrometers.

Each of the first and second support films 322 and 324 may include tri-acetyl cellulose (TAC), a cyclic olefin polymer (COP), polyethylene terephthalate (PET), or acryl such as an acrylate compound or polymer. The first support film 322 corresponds to an inner support film adjacent to the first substrate 112 of FIG. 4, and the second support film 324 corresponds to an outer support film adjacent to the optical sheet 126 of FIG. 4. The thickness of the first support film 322 may be thinner than the thickness of the second support film 324. For example, the thickness of the first support film 322 may be about 40 micrometers, and the thickness of the second support film 324 may be about 60 micrometers. However, the thicknesses of the first support film 322 and the second support film 324 may be the same, but are not so limited. The first support film 322 may have phase retardation values of a thickness direction and of a plane direction. The phase retardation values of the thickness direction and of the plane direction may be within a range of −250 nm to +250 nm. Alternatively, the first support film 322 may not have phase retardation values of the thickness direction and of the plane direction, and thus manufacturing costs may be decreased because such a first support film 322 is cheap.

The support films 322 and 324 may be referred to as protective films.

The adhesive layer 330 at the outer surface of the first support film 322 may include a pressure sensitive adhesive (PSA). The first polarizer 118 is attached to the first substrate 112 of FIG. 4 via the adhesive layer 330.

In the present invention, the first polarizer 118 includes the adhesive layer 330. Alternatively, the adhesive layer 330 may be formed on the first substrate 112 of FIG. 4.

The light absorption layer 340 at the outer surface of the second support film 324 includes a binder and light absorption materials 340a dispersed in the binder. The binder may include acryl such as an acrylate compound or polymer, and the light absorption material 340a may include a material that absorbs light within a wavelength range between red and green. For instance, the light absorbing material 340a may include a metal-coordination tetra-azaporphyrin compound expressed by the chemical formula 1.

The metal-coordination tetra-azaporphyrin compound may be present in an amount of 0.6 wt % to 1.2 wt % based on the acryl binder.

If the content of the metal-coordination tetra-azaporphyrin compound is larger than 1.2 wt %, the intensity of the absorption spectrum at the wavelength region of 590 nm increases, and the light absorption rate at the wavelength region of 590 nm also increases. Therefore, the color gamut increases, and the brightness decreases.

In contrast, if the content of the metal-coordination tetra-azaporphyrin compound is smaller than 0.6 wt %, the intensity of the absorption spectrum at the wavelength region of 590 nm decreases, and the light absorption rate at the wavelength region of 590 nm also decreases. Therefore, the brightness increases, and the color gamut decreases.

The metal-coordination tetra-azaporphyrin compound may be present, beneficially, in an amount of 0.8 wt % to 1.1 wt %, and more beneficially, in an amount of about 1.0 wt % based on the acryl binder.

The light absorption layer 340 may further include beads 340b therein. The beads 340b may include poly(methyl) methacrylate (PMMA). The beads 340b diffuse light and form an uneven surface to thereby prevent a wet-out phenomenon between films contacting each other and prevent a surface of a film from being scratched.

In the present invention, the light absorption layer 340 includes the beads 340b, but the beads 340b may be omitted.

The light absorption layer 340 may be formed by a coating method and may have a thickness of about 3 micrometers to about 10 micrometers.

The first polarizer 118 according to the first embodiment of the present invention includes the light absorption layer 340 at its surface, and the overlap region in the wavelength range between red and green of light from the LED package is removed. Thus, the color gamut of the LCD device increases.

Second Embodiment

Figure 9:
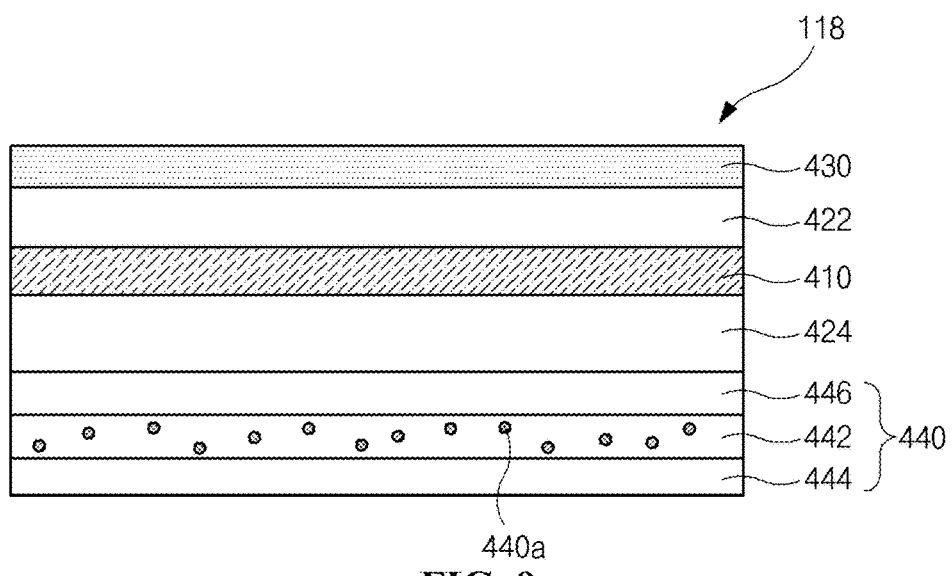
FIG. 9 is a cross-sectional view schematically illustrating a first polarizer including a light absorption layer according to a second embodiment of the present invention.

FIG. 9 is a cross-sectional view schematically illustrating a first polarizer including a light absorption layer according to a second embodiment of the present invention.

In FIG. 9, the first polarizer 118 according to the second embodiment of the present invention includes a polarizing film 410, first and second support films 422 and 424, an adhesive layer 430, and a light absorption sheet 440.

The polarizing film 410 is disposed between the first and second support films 422 and 424. The adhesive layer 430 is disposed at an outer surface of the first support film 422, and the light absorption sheet 440 is disposed at an outer surface of the second support film 424.

The polarizing film 410 may include polyvinyl alcohol (PVA). The polarizing film 410 may be formed by dyeing a PVA film with iodine ions or dichroic dyes and stretching the dyed PVA film. The polarizing film 410 has an absorption axis along a stretching direction, and the polarizing film 410 absorbs light vibrating in a direction parallel to the absorption axis and transmits light vibrating in a direction perpendicular to the absorption axis. The polarizing film 410 may have a thickness of about 25 micrometers.

Each of the first and second support films 422 and 424 may include tri-acetyl cellulose (TAC), cyclic olefin polymer (COP), polyethylene terephthalate (PET), or acryl such as an acrylate compound or polymer. The first support film 422 corresponds to an inner support film adjacent to the first substrate 112 of FIG. 4, and the second support film 424 corresponds to an outer support film adjacent to the optical sheet 126 of FIG. 4. The thickness of the first support film 422 may be thinner than the thickness of the second support film 424. For example, the thickness of the first support film 422 may be about 40 micrometers, and the thickness of the second support film 424 may be about 60 micrometers. However, the thicknesses of the first support film 422 and the second support film 424 may be the same, and they are not so limited. The first support film 422 may have phase retardation values of a thickness direction and of a plane direction. The phase retardation values of the thickness direction and of the plane direction may be within a range of −250 nm to +250 nm. Alternatively, the first support film 422 may not have the phase retardation values of the thickness direction and of the plane direction, and thus manufacturing costs may be decreased because such a first support film 422 is cheap.

The support films 422 and 424 may be referred to as protective films.

The adhesive layer 430 at the outer surface of the first support film 422 may include a pressure sensitive adhesive (PSA). The first polarizer 118 is attached to the first substrate 112 of FIG. 4 via the adhesive layer 430.

In the present invention, the first polarizer 118 includes the adhesive layer 430. Alternatively, the adhesive layer 430 may be formed on the first substrate 112 of FIG. 4.

The light absorption sheet 440 at the outer surface of the second support film 424 includes a light absorption layer 442 and first and second base films 444 and 446.

Each of the first and second base films 444 and 446 may include polyethylene terephthalate or polycarbonate. Each of the first and second base films 444 and 446 may have a thickness of about 100 micrometers.

The light absorption layer 442 is disposed between the first and second base films 444 and 446. Therefore, wrinkles are prevented from being generated in the light absorption sheet 440, and image qualities of the LCD device are prevented from being lowered.

The light absorption layer 442 may have a thickness of about 3 micrometers to about 20 micrometers.

The light absorption layer 442 includes a binder and light absorption materials 440a dispersed in the binder. The binder may include acryl such as an acrylate compound or polymer, and the light absorption material 440a may include a material absorbing light within a wavelength range between red and green. For instance, the light absorbing material 440a may include a metal-coordination tetra-azaporphyrin compound expressed by the chemical formula 1.

The metal-coordination tetra-azaporphyrin compound may be present in an amount of 0.6 wt % to 1.2 wt % based on the acryl binder.

If the content of the metal-coordination tetra-azaporphyrin compound is larger than 1.2 wt %, the intensity of the absorption spectrum at the wavelength region of 590 nm increases, and the light absorption rate at the wavelength region of 590 nm also increases. Therefore, the color gamut increases, and the brightness decreases.

On the other hand, if the content of the metal-coordination tetra-azaporphyrin compound is smaller than 0.6 wt %, the intensity of the absorption spectrum at the wavelength region of 590 nm decreases, and the light absorption rate at the wavelength region of 590 nm also decreases. Therefore, the brightness increases, and the color gamut decreases.

The metal-coordination tetra-azaporphyrin compound may be present, beneficially, in an amount of 0.8 wt % to 1.1 wt %, and more beneficially, in an amount of about 1.0 wt % based on the acryl binder.

The second base film 446 may be omitted, and the light absorption layer 442 may be directly attached to the second support film 424. In this case, the light absorption layer 442 may have an adhesive property.

The light absorption sheet 440 may be formed by a lamination method or a coating method.

The first polarizer 118 according to the second embodiment of the present invention includes the light absorption layer 442 at its surface, and the overlap region in the wavelength range between red and green light from the LED package is removed. Thus, the color gamut of the LCD device increases.

The light absorption layer 442 is disposed between the first and second base films 444 and 446, and the wrinkles are prevented from being generated in the light absorption sheet 440, and the image qualities of the LCD device are prevented from being lowered.

Third Embodiment

Figure 10:
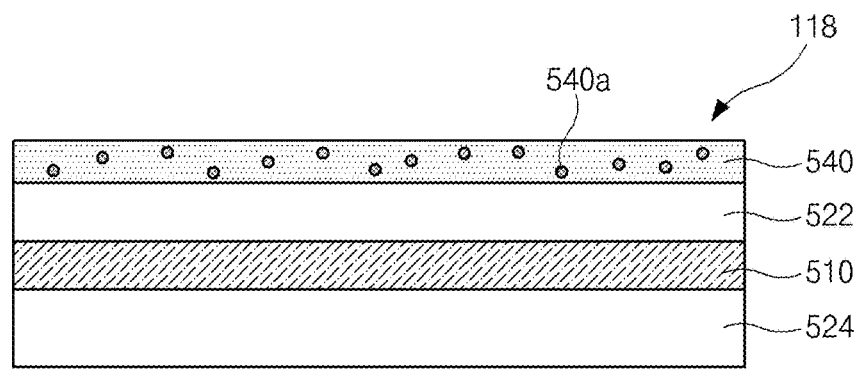
FIG. 10 is a cross-sectional view schematically illustrating a first polarizer including a light absorption layer according to a third embodiment of the present invention.

FIG. 10 is a cross-sectional view schematically illustrating a first polarizer including a light absorption layer according to a third embodiment of the present invention.

In FIG. 10, the first polarizer 118 according to the third embodiment of the present invention includes a polarizing film 510, first and second support films 522 and 524, and a light absorption layer 540.

The polarizing film 510 is disposed between the first and second support films 522 and 524, and the light absorption layer 540 is disposed at an outer surface of the first support film 522.

The polarizing film 510 may include polyvinyl alcohol (PVA). The polarizing film 510 may be formed by dyeing a PVA film with iodine ions or dichroic dyes and stretching the dyed PVA film. The polarizing film 510 has an absorption axis along a stretching direction, and the polarizing film 510 absorbs light vibrating in a direction parallel to the absorption axis and transmits light vibrating in a direction perpendicular to the absorption axis. The polarizing film 510 may have a thickness of about 25 micrometers.

Each of the first and second support films 522 and 524 may include tri-acetyl cellulose (TAC), cyclic olefin polymer (COP), polyethylene terephthalate (PET), or acryl such as an acrylate compound or polymer. The first support film 522 corresponds to an inner support film adjacent to the first substrate 112 of FIG. 4, and the second support film 524 corresponds to an outer support film adjacent to the optical sheet 126 of FIG. 4. The thickness of the first support film 522 may be thinner than the thickness of the second support film 524. For example, the thickness of the first support film 522 may be about 40 micrometers, and the thickness of the second support film 524 may be about 60 micrometers. However, the thicknesses of the first support film 522 and the second support film 524 may be the same, and they are not so limited. The first support film 522 may have phase retardation values of a thickness direction and of a plane direction. The phase retardation values of the thickness direction and of the plane direction may be within a range of −250 nm to +250 nm. Alternatively, the first support film 522 may not have the phase retardation values of the thickness direction and of the plane direction, and thus manufacturing costs may be decreased because such a first support film 522 is cheap.

The support films 522 and 524 may also be referred to as protective films.

The light absorption layer 540 at the outer surface of the first support film 522 includes a binder and light absorption materials 540a dispersed in the binder. The binder may include acryl such as an acrylate compound or polymer, and the light absorption material 540a may include a material absorbing light within a wavelength range between red and green. For instance, the light absorbing material 540a may include a metal-coordination tetra-azaporphyrin compound expressed by the chemical formula 1.

The metal-coordination tetra-azaporphyrin compound may be present in an amount of 0.6 wt % to 1.2 wt % based on the acryl binder.

If the content of the metal-coordination tetra-azaporphyrin compound is larger than 1.2 wt %, the intensity of the absorption spectrum at the wavelength region of 590 nm increases, and the light absorption rate at the wavelength region of 590 nm also increases. Therefore, the color gamut increases, and the brightness decreases.

On the other hand, if the content of the metal-coordination tetra-azaporphyrin compound is smaller than 0.6 wt %, the intensity of the absorption spectrum at the wavelength region of 590 nm decreases, and the light absorption rate at the wavelength region of 590 nm also decreases. Therefore, the brightness increases, and the color gamut decreases.

The metal-coordination tetra-azaporphyrin compound may be present, beneficially, in an amount of 0.8 wt % to 1.1 wt %, and more beneficially, in an amount of about 1.0 wt % based on the acryl binder.

The light absorption layer 540 may have an adhesive property, and the first polarizer 118 may be attached to the first substrate 112 of FIG. 4 via the light absorption layer 540. The light absorption layer 540 may include a pressure sensitive adhesive (PSA).

The light absorption layer 540 may be formed by a coating method.

The first polarizer 118 according to the third embodiment of the present invention includes the light absorption layer 540 at its surface, and the overlap region in the wavelength range between red and green light from the LED package is removed. Thus, the color gamut of the LCD device increases.

Since the light absorption layer 540 functions as an adhesive layer, materials are reduced, manufacturing process are simplified, and a volume of the LCD device is decreased.

Fourth Embodiment

Figure 11:
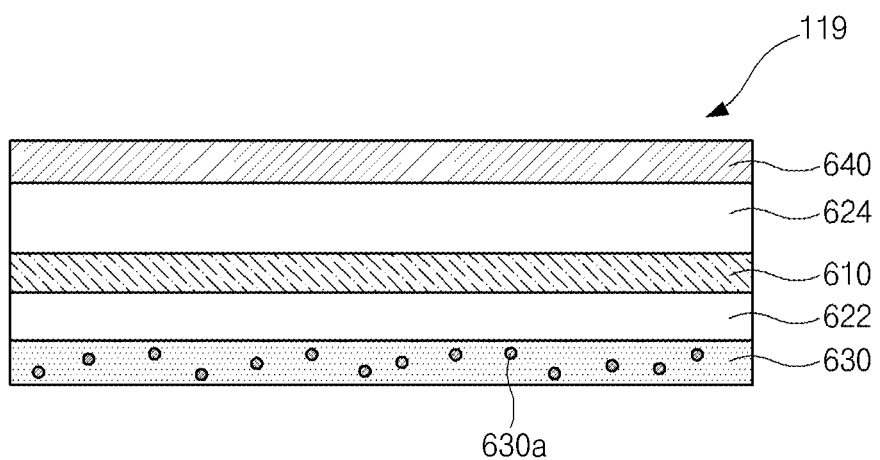
FIG. 11 is a cross-sectional view schematically illustrating a second polarizer including a light absorption layer according to a fourth embodiment of the present invention.

FIG. 11 is a cross-sectional view schematically illustrating a second polarizer including a light absorption layer according to a fourth embodiment of the present invention.

In FIG. 11, the second polarizer 119 according to the fourth embodiment of the present invention includes a polarizing film 610, first and second support films 622 and 624, and a light absorption layer 630. The polarizing film 610 is disposed between the first and second support films 622 and 624, and the light absorption layer 630 is disposed at an outer surface of the first support film 622.

The polarizing film 610 may include polyvinyl alcohol (PVA). The polarizing film 610 may be formed by dyeing a PVA film with iodine ions or dichroic dyes and stretching the dyed PVA film. The polarizing film 610 has an absorption axis along a stretching direction, and the polarizing film 610 absorbs light vibrating in a direction parallel to the absorption axis and transmits light vibrating in a direction perpendicular to the absorption axis. The polarizing film 610 may have a thickness of about 25 micrometers.

Each of the first and second support films 622 and 624 may include tri-acetyl cellulose (TAC), cyclic olefin polymer (COP), polyethylene terephthalate (PET), or acryl such as an acrylate compound or polymer. The first support film 622 corresponds to an inner support film adjacent to the second substrate 114 of FIG. 4, and the second support film 624 corresponds to an outer support film. The thickness of the first support film 622 may be thinner than the thickness of the second support film 624. For example, the thickness of the first support film 622 may be about 40 micrometers, and the thickness of the second support film 624 may be about 60 micrometers. However, the thicknesses of the first support film 622 and the second support film 624 may be the same, and are not so limited. The first support film 622 may have phase retardation values of a thickness direction and of a plane direction. The phase retardation values of the thickness direction and of the plane direction may be within a range of −250 nm to +250 nm. Alternatively, the first support film 622 may not have the phase retardation values of the thickness direction and of the plane direction, and thus manufacturing costs may be decreased because such a first support film 622 is cheap.

The support films 622 and 624 may also be referred to as protective films.

The light absorption layer 630 at the outer surface of the first support film 622 includes a binder and light absorption materials 630a dispersed in the binder. The binder may include acryl such as an acrylate compound or polymer, and the light absorption material 630a may include a material absorbing light within a wavelength range between red and green. For instance, the light absorbing material 630a may include a metal-coordination tetra-azaporphyrin compound expressed by the chemical formula 1.

The metal-coordination tetra-azaporphyrin compound may be present in an amount of 0.6 wt % to 1.2 wt % based on the acryl binder.

If the content of the metal-coordination tetra-azaporphyrin compound is larger than 1.2 wt %, the intensity of the absorption spectrum at the wavelength region of 590 nm increases, and the light absorption rate at the wavelength region of 590 nm also increases. Therefore, the color gamut increases, and the brightness decreases.

On the other hand, if the content of the metal-coordination tetra-azaporphyrin compound is smaller than 0.6 wt %, the intensity of the absorption spectrum at the wavelength region of 590 nm decreases, and the light absorption rate at the wavelength region of 590 nm also decreases. Therefore, the brightness increases, and the color gamut decreases.

The metal-coordination tetra-azaporphyrin compound may be present, beneficially, in an amount of 0.8 wt % to 1.1 wt %, and more beneficially, in an amount of about 1.0 wt % based on the acryl binder.

Thelight absorption layer 630 may have an adhesive property, and the second polarizer 119 may be attached to the second substrate 114 of FIG. 4 via the light absorption layer 630. The light absorption layer 630 may include a pressure sensitive adhesive (PSA).

The light absorption layer 630 may be formed by a coating method.

In addition, the second polarizer 119 may further include a surface treatment layer 640 at an outer surface of the second support film 624. The surface treatment layer 640 may have functions such as low reflection, anti glare and/or hard coating by surface treatments. The surface treatment layer 640 may include acryl such as an acrylate compound or polymer, but it is not so limited.

The second polarizer 119 according to the fourth embodiment of the present invention includes the light absorption layer 630 at its surface, and the overlap region in the wavelength range between red and green light from the LED package is removed. Thus, the color gamut of the LCD device increases.

Since the light absorption layer 540 functions as an adhesive layer, materials are reduced, manufacturing processes are simplified, and the volume of the LCD device is decreased.

In the fourth embodiment of the present invention, since the external light, which is incident on and is reflected by the liquid crystal panel 110 of FIG. 4, is absorbed by the light absorption layer 630, reflection of the external light decreases. Therefore, the contrast ratio of the LCD device increases.

Moreover, in the fourth embodiment of the present invention, when light from the backlight unit 120 of FIG. 4 passes through the liquid crystal panel 110 of FIG. 4 and is outputted to the outside, light scattered, diffracted or reflected by the liquid crystal layer is absorbed by the light absorption layer 630 of the second polarizer 119. Thus, the degree of the polarization of the second polarizer 119 increases, and black visibility further decreases. Therefore, the front contrast ratio of the LCD device is increased, and viewing angle properties are improved.

Fifth Embodiment

Figure 12:
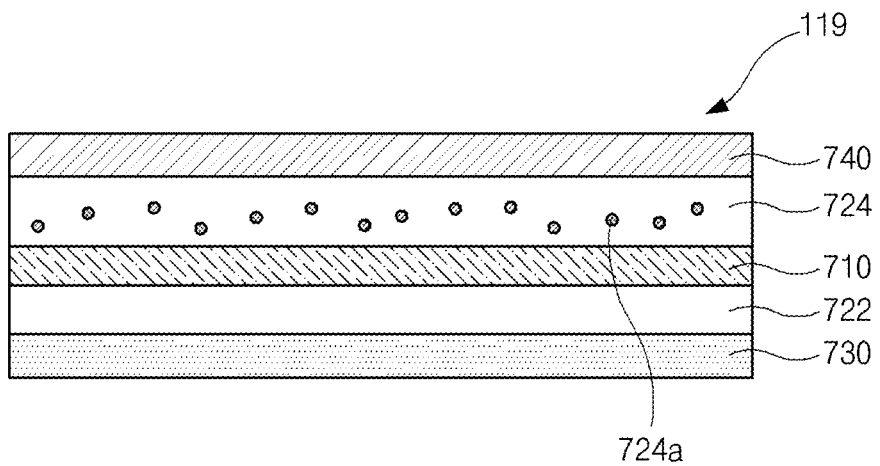
FIG. 12 is a cross-sectional view schematically illustrating a second polarizer including a light absorption layer according to a fifth embodiment of the present invention.

FIG. 12 is a cross-sectional view schematically illustrating a second polarizer including a light absorption layer according to a fifth embodiment of the present invention.

In FIG. 12, the second polarizer 119 according to the fifth embodiment of the present invention includes a polarizing film 710, a protective film 722, a light absorption layer 724, and an adhesive layer 730. The polarizing film 710 is disposed between the protective film 722 and the light absorption layer 724, and the adhesive layer 730 is disposed at an outer surface of the protective film 722.

The polarizing film 710 may include polyvinyl alcohol (PVA). The polarizing film 710 may be formed by dyeing a PVA film with iodine ions or dichroic dyes and stretching the dyed PVA film. The polarizing film 710 has an absorption axis along a stretching direction, and the polarizing film 710 absorbs light vibrating in a direction parallel to the absorption axis and transmits light vibrating in a direction perpendicular to the absorption axis. The polarizing film 710 may have a thickness of about 25 micrometers.

The protective film 722 may include tri-acetyl cellulose (TAC), cyclic olefin polymer (COP), polyethylene terephthalate (PET), or acryl such as an acrylate compound or polymer. The protective film 722 is disposed adjacently to the second substrate 114 of FIG. 4. The protective film 722 may have phase retardation values of a thickness direction and of a plane direction to compensate viewing angles. The phase retardation values of the thickness direction and of the plane direction may be within a range of −250 nm to +250 nm. Alternatively, the protective film 722 may not have the phase retardation values of the thickness direction and of the plane direction, and thus manufacturing costs may be decreased because such a protective film 722 is inexpensive.

The adhesive layer 730 at the outer surface of the protective film 722 may include a pressure sensitive adhesive (PSA). The second polarizer 119 is attached to the second substrate 114 of FIG. 4 via the adhesive layer 730.

The second polarizer 119 includes the adhesive layer 730. Alternatively, the adhesive layer 730 may be formed on the second substrate 114 of FIG. 4.

The light absorption layer 724 includes a binder and light absorption materials 724a dispersed in the binder. The light absorption material 724a may include a material absorbing light within a wavelength range between red and green. For instance, the light absorbing material 724a may include a metal-coordination tetra-azaporphyrin compound expressed by the chemical formula 1.

The metal-coordination tetra-azaporphyrin compound may be present in an amount of 0.6 wt % to 1.2 wt % based on the acryl binder.

If the content of the metal-coordination tetra-azaporphyrin compound is larger than 1.2 wt %, the intensity of the absorption spectrum at the wavelength region of 590 nm increases, and the light absorption rate at the wavelength region of 590 nm also increases. Therefore, the color gamut increases, and the brightness decreases.

On the other hand, if the content of the metal-coordination tetra-azaporphyrin compound is smaller than 0.6 wt %, the intensity of the absorption spectrum at the wavelength region of 590 nm decreases, and the light absorption rate at the wavelength region of 590 nm also decreases. Therefore, the brightness increases, and the color gamut decreases.

The metal-coordination tetra-azaporphyrin compound may be present, beneficially, in an amount of 0.8 wt % to 1.1 wt %, and more beneficially, in an amount of about 1.0 wt % based on the acryl binder.

The binder may be selected from tri-acetyl cellulose (TAC), cyclic olefin polymer (COP), polyethylene terephthalate (PET), or acryl such as an acrylate compound or polymer.

The protective film 722 serves as an inner support film, and the light absorption layer 724 functions as an outer support film. The thickness of the light absorption layer 724 may be thicker than the thickness of the protective film 722. For example, the thickness of the light absorption layer 724 may be about 60 micrometers, and the thickness of the protective film 722 may be about 40 micrometers. However, the thicknesses of the light absorption layer 724 and the protective film 722 may be the same, and they are not limited to this.

In addition, the second polarizer 119 may further include a surface treatment layer 740 at an outer surface of the light absorption layer 724. The surface treatment layer 740 may have functions such as low reflection, anti glare and/or hard coating by surface treatments. The surface treatment layer 740 may include acryl such as an acrylate compound or polymer, but it is not so limited.

The second polarizer 119 according to the fifth embodiment of the present invention includes the light absorption layer 724 at its surface, and the overlap region in the wavelength range between red and green light from the LED package is removed. Thus, the color gamut of the LCD device increases.

In the fifth embodiment of the present invention, since the external light, which is incident on and is reflected by the liquid crystal panel 110 of FIG. 4, is absorbed by the light absorption layer 724, reflection of the external light decreases. Therefore, the contrast ratio of the LCD device increases.

Moreover, in the fifth embodiment of the present invention, when light from the backlight unit 120 of FIG. 4 passes through the liquid crystal panel 110 of FIG. 4 and is outputted to the outside, light scattered, diffracted or reflected by the liquid crystal layer is absorbed by the light absorption layer 724 of the second polarizer 119. Thus, the degree of the polarization of the second polarizer 119 increases, and black visibility further decreases. Therefore, the front contrast ratio of the LCD device is increased, and viewing angle properties are improved.

In the fifth embodiment of the present invention, the second polarizer 119 includes the light absorption layer 724 at an outer surface of the polarizing film 710. The light absorption layer 724 may be embodied by adding the light absorption materials 724a in an outer support film. Alternatively, the light absorption layer 724 at the outer surface of the polarizing film 710 may be embodied by removing the light absorption materials 724a from the outer support film and adding the light absorption materials 724a in the surface treatment layer 740.

The LCD device according to the fourth and fifth embodiments, in which the second polarizer includes the light absorption layer, has advantages of low reflectance, an increasing contrast ratio, and an improved viewing angle properties as compared to the LCD device according to the first, second and third embodiments, in which the second polarizer includes the light absorption layer. For instance, on the basis of 550 nm, the LCD device according to the first, second and third embodiments has the reflectance of about 5.5% while the LCD device according to the fourth and fifth embodiments has the reflectance of about 3.7%. Therefore, the LCD device according to the fourth and fifth embodiments has the reflectance decreased by about 33% in comparison with the LCD device according to the first, second and third embodiments.

Furthermore, the LCD device according to the fourth and fifth embodiments has the front contrast ratio improved by about 8% in the outer circumstances having illuminance of 0 Lux and the front contrast ratio improved by about 25% in the outer circumstances having illuminance of 200 Lux as compared to the LCD device according to the first, second, and third embodiments.

In the above embodiments, the LCD device includes an edge type backlight unit. Alternatively, the LCD device of the present invention may include a direct type backlight unit, in which the light guide panel is omitted.

In the present invention, by adjusting the total content and the mixing ratio of the yellow and red phosphors of the LED package containing the blue LEC chip and applying the light absorption layer absorbing light within a wavelength range between red and green to the upper polarizer or the lower polarizer of the liquid crystal panel, a change in components can be minimized, and the LCD device having the wide color gamut can be achieved in a simple way.

The light absorption layer can be formed at relatively low costs. An increase in the manufacturing costs of the LCD device is minimized, and the LCD device has a competitive price.

In addition, the light absorption layer can be disposed at one of various positions in the upper polarizer or the lower polarizer of the liquid crystal panel, and the light absorption layer can have further functions by adding the beads or the adhesive. Thus, the degree of design can be increased.

When the light absorption layer is applied to the upper polarizer of the liquid crystal panel, the reflectance of the external light can be lowered, and the front contrast ratio and the viewing angle properties can be improved.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:
1. A liquid crystal display device comprising:
a liquid crystal panel comprising a first substrate, a second substrate, and first and second polarizers at respective outer surfaces of the first and second substrates; and
a backlight unit under the liquid crystal panel, the backlight unit comprising a light source,
wherein the light source comprises a first luminous body having a first peak wavelength, a second luminous body having a second peak wavelength greater than the first peak wavelength, and a third luminous body having a third peak wavelength greater than the second peak wavelength, and
wherein the first polarizer comprises a light absorption layer containing an absorption peak between the second peak wavelength and the third peak wavelength, the light absorption layer further comprising a binder and 0.6 wt % to 1.2 wt % based on the binder of a metal-coordination tetra-azaporphyrin compound of chemical formula:

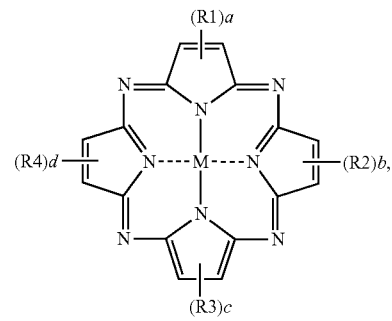

wherein:
M is selected from the group consisting of Ni, Mg, Mn, Co, Cu, Ru and V to which at least one ligand selected from the group consisting of $NH_3$, $H_2O$ and a halogen atom is coordinated;

each of R1, R2, R3, and R4 is independently selected from the group consisting of a C1 to C10 alkyl group and a C6 to C30 aromatic group; and each of a, b, c and d is 1 or 2.

2. The liquid crystal display device of claim 1, wherein the first luminous body comprises a light emitting diode chip, the second luminous body comprises a first phosphor, and the third luminous body comprises a second phosphor.

3. The liquid crystal display device of claim 2, wherein a mixing ratio by weight of the first phosphor to the second phosphor is 55:45, and wherein an overlap ratio of a color gamut to a DCI color standard is 95%.

4. The liquid crystal display device of claim 3, wherein the light source further comprises a resin layer in which the first and second phosphors are dispersed, and the first and second phosphors are present in a total amount of 2.0 wt % to 20 wt % of a content of the resin layer.

5. The liquid crystal display device of claim 2, wherein the light emitting diode chip is a blue light emitting diode chip, the first phosphor is a yellow phosphor, and the second phosphor is a red phosphor.

6. The liquid crystal display device of claim 1, wherein the first polarizer further comprises a polarizing film, and the light absorption layer is disposed between the first substrate and the polarizing film.

7. The liquid crystal display device of claim 6, wherein the light absorption layer further comprises an adhesive.

8. The liquid crystal display device of claim 1, wherein the first polarizer further comprises a polarizing film, and the polarizing film is disposed between the light absorption layer and the first polarizer.

9. The liquid crystal display device of claim 8, wherein the first polarizer is disposed between the first substrate and the backlight unit, where the first polarizer further comprises first and second base films between the polarizing film and the backlight unit, and the light absorption layer is disposed between the first and second base films.

10. The liquid crystal display device of claim 8, wherein the first polarizer is disposed between the first substrate and the backlight unit, and the light absorption layer further comprises beads.

11. The liquid crystal display device of claim 8, wherein the light absorption layer contacts the polarizing film.

12. The liquid crystal display device of claim 8, wherein the first polarizer further comprises a surface treatment layer, and the light absorption layer is disposed between the surface treatment layer and the polarizing film.

13. The liquid crystal display device of claim 1, wherein the first peak wavelength is 444 nm, the second peak wavelength is 540 nm, and the third peak wavelength is 650 nm.

14. A polarizer comprising:
a polarizing film; and
a light absorption layer at a surface of the polarizing film, the light absorption layer comprising a binder and 0.6 wt % to 1.2 wt % based on the binder of a metal-coordination tetra-azaporphyrin compound of chemical formula:

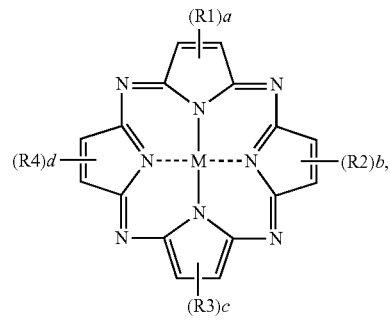

wherein:
M is selected from the group consisting of Ni, Mg, Mn, Co, Cu, Ru and V to which at least one ligand selected from the group consisting of $NH_3$, $H_2O$ and a halogen atom is coordinated;
each of R1, R2, R3, and R4 is independently selected from the group consisting of a C1 to C10 alkyl group and a C6 to C30 aromatic group; and
each of a, b, c and d is 1 or 2.

15. The polarizer of claim 14, wherein the light absorption layer further comprises beads.

16. The polarizer of claim 14, wherein the polarizer further includes first and second base films at the surface of the polarizing film, and the light absorption layer is disposed between the first and second base films.

17. The polarizer of claim 14, wherein the light absorption layer further comprises an adhesive.

18. The polarizer of claim 17, wherein the light absorption layer contacts the polarizing film.

19. The polarizer of claim 17, wherein the polarizer further comprises a surface treatment layer, and the light absorption layer is disposed between the surface treatment layer and the polarizing film.

* * * * *